US010439661B1

(12) United States Patent
Heydari

(10) Patent No.: US 10,439,661 B1
(45) Date of Patent: Oct. 8, 2019

(54) LOW-POWER HIGH-SPEED SIGNALING SCHEME OVER TRANSMISSION LINE WITH UNMATCHED TERMINATIONS

(71) Applicant: Payam Heydari, Irvine, CA (US)

(72) Inventor: Payam Heydari, Irvine, CA (US)

(*) Notice: Subject to any disclaimer, the term of this patent is extended or adjusted under 35 U.S.C. 154(b) by 0 days.

(21) Appl. No.: 15/899,333

(22) Filed: Feb. 19, 2018

Related U.S. Application Data

(60) Provisional application No. 62/460,821, filed on Feb. 19, 2017.

(51) Int. Cl.
H04B 1/525 (2015.01)
H04B 1/04 (2006.01)
H03H 17/06 (2006.01)
H04L 27/36 (2006.01)
H03H 17/00 (2006.01)

(52) U.S. Cl.
CPC .......... *H04B 1/0475* (2013.01); *H03H 17/06* (2013.01); *H04B 1/0483* (2013.01); *H04L 27/36* (2013.01); *H03H 2017/0081* (2013.01)

(58) Field of Classification Search
CPC ..... H04B 1/0475; H04B 1/0483; H04L 27/36; H03H 17/06; H03H 2017/0081
See application file for complete search history.

(56) References Cited

U.S. PATENT DOCUMENTS

| | | | | |
|---|---|---|---|---|
| 7,269,212 B1* | 9/2007 | Chau | ................. | H04L 25/03878 326/80 |
| 2006/0181283 A1* | 8/2006 | Wajcer | ................... | G01R 31/11 324/539 |
| 2006/0188043 A1* | 8/2006 | Zerbe | .................... | H04L 1/0026 375/346 |
| 2006/0251194 A1* | 11/2006 | Bublil | ............... | H04L 25/03012 375/348 |
| 2009/0225900 A1* | 9/2009 | Yamaguchi | ....... | H04L 25/03057 375/296 |
| 2011/0267073 A1* | 11/2011 | Chengson | .......... | G01R 31/3171 324/628 |
| 2013/0285584 A1* | 10/2013 | Kim | ........................ | H02P 25/18 318/400.21 |
| 2016/0294585 A1* | 10/2016 | Rahman | .............. | H04L 25/0292 |

* cited by examiner

Primary Examiner — Dac V Ha
(74) Attorney, Agent, or Firm — Richard E. Ballard

(57) ABSTRACT

A circuit includes a transmitter, a transmission line, and a receiver coupled to the transmitter through the transmission line, the transmission line used to transmit data at high-speed rates. At least one of the transmitter or receiver has associated therewith an unmatched termination, wherein either the transmitter or the receiver includes a finite impulse response (FIR) filter configured to cancel a reflected signal at a cancellation point situated at an input of the receiver, at an input of a driver, or at an output of the driver, the driver being coupled to an output of the transmitter, such that the reflected signal is substantially removed from the signal detected by the receiver.

20 Claims, 12 Drawing Sheets

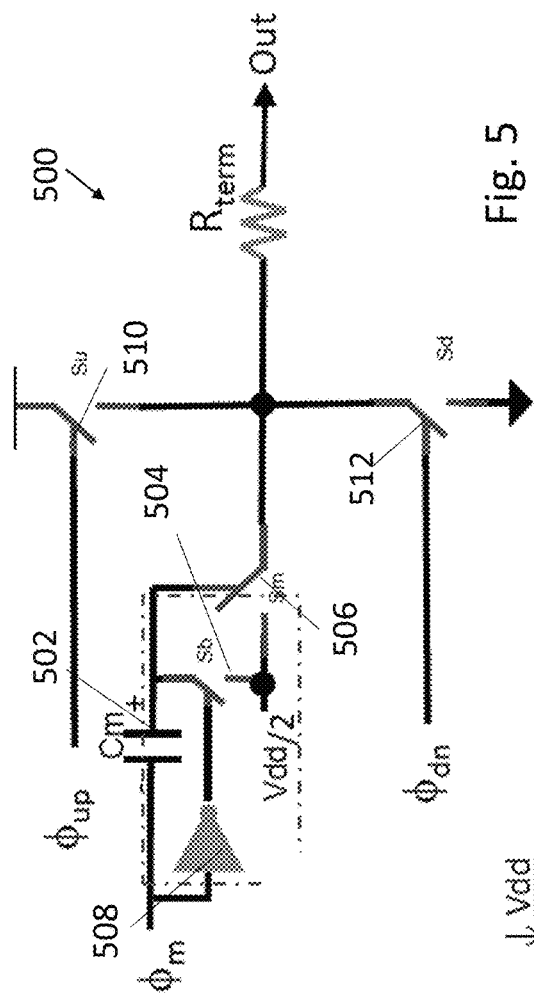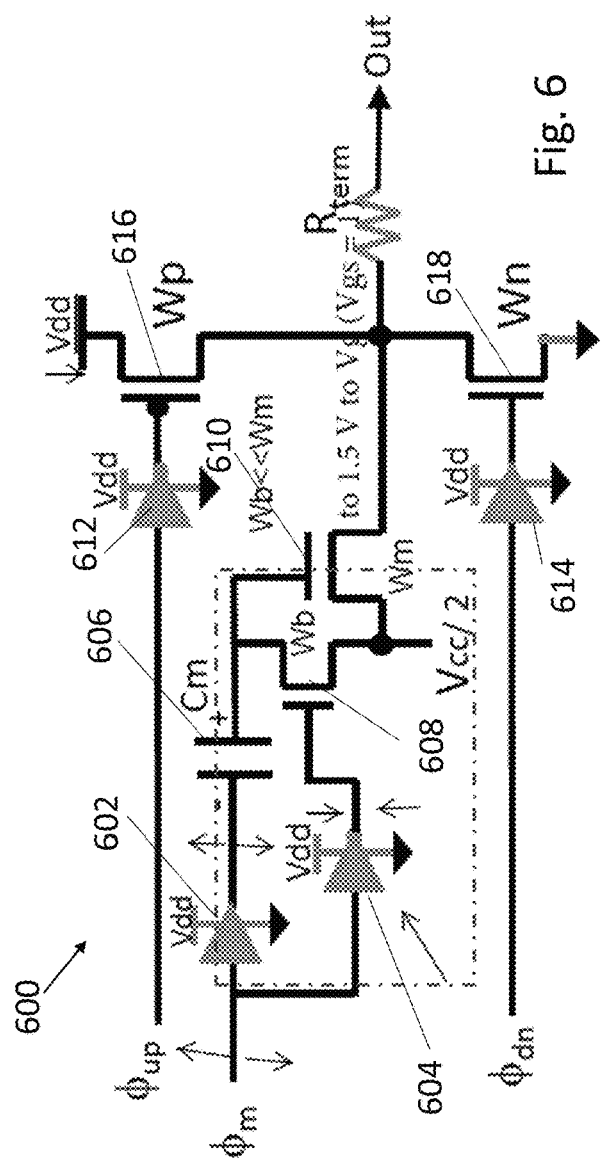

Driver #3: Encoded Input bits for E (even)/O (odd) Symbols of Double-PAM3

| Binary Input Data | | | Driver #3 Encoded Input bits | | | | Driver Analog Output Levels | |
|---|---|---|---|---|---|---|---|---|
| b0 | b1 | b2 | $E_0$ | $E_1$ | $O_0$ | $O_1$ | E Level | O Level |
| Idle State | | | High Impedance All Switches Open | | High Impedance All Switches Open | | 0 | 0 |
| 0 | 0 | 0 | 1 | 0 | 1 | 1 | −1 | +1 |
| 0 | 0 | 1 | 0 | 0 | 0 | 0 | 0 | −1 |
| 0 | 1 | 1 | 1 | 0 | 0 | 1 | −1 | −1 |
| 0 | 1 | 0 | 1 | 1 | 1 | 1 | 0 | +1 |
| 1 | 1 | 0 | 0 | 0 | 1 | 0 | +1 | +1 |
| 1 | 1 | 1 | 1 | 1 | 1 | 0 | −1 | 0 |
| 1 | 0 | 1 | 1 | 1 | 0 | 0 | +1 | −1 |
| 1 | 0 | 0 | 1 | 1 | 1 | 0 | +1 | 0 |

1402 — Binary Input Data
1404 — Driver #3
1406 — Driver Analog Output Levels

LOW-POWER HIGH-SPEED SIGNALING SCHEME OVER TRANSMISSION LINE WITH UNMATCHED TERMINATIONS

CROSS REFERENCE TO RELATED APPLICATIONS

The application claims priority to U.S. Provisional Application No. 62/460,821, filed on Feb. 19, 2017, filed by Payam Heydari, and entitled "Ultra Low-Power High-speed Unterminated-Receiver Signaling".

TECHNICAL FIELD

The invention relates to high-speed data communication systems, and more particularly to those with unterminated receivers.

BACKGROUND ART

High-speed low-power connectivity over a short communication link are prevalent in a variety of applications. Typically, a single integrated circuit (IC) (or "semiconductor", "chip") connects to another IC over a distance in the millimeter or centimeter ranges. High speeds cause the communication link (or "line", "channel") to act like transmission lines therefore termination is needed on both ends (both ICs). The terminations absorb the received signal to minimize or eliminate any signal reflected. However, termination at both ends results in increased power consumption.

A technique to reduce power is to use source-termination where the source was terminated, with typically a 50 Ohm resistance, and no far-end (or "destination") termination. A major drawback of an unterminated receiver in wireline signaling is the slow absorption of signal reflections, which causes transmission bandwidth limitations, particularly with longer channels. The longer the channel, the longer the settling time of the (signal) reflections, and therefore, the lower the error-free signaling rate. For instance, if previous symbol(s)' reflections do not settle to a low enough amplitude before the next symbol in the line arrives at the receiver, the reflections can corrupt the next symbol unless they are cancelled.

At high speeds, all sort of capacitance parasitics are introduced into the signal being transmitted from one end to another or from one device to another. These types of parasitics are negligible with links or connections within an IC, but they are typically large enough external links between two ICs and thus result in considerable performance degradation of the signal traveling over such links for instance. For example, electro-static discharge (ESD) devices are used at IC pads, typically made of diodes, to absorb the electrical shocks but this leads to additional capacitance at the IC pads and at high speeds, the impedance associated with ESD capacitances cannot be neglected.

In high-speed wireline communication, over an impedance-controlled transmission line, typically, both sides of the wireline are terminated and the high-bandwidth signal is maximally absorbed at both ends of the wireline (or link). Accordingly, the reflection settling times are minimized. However, double termination comes at a cost such as increased power and decreased signal (or lower performance).

Accordingly, a circuit is needed for increased performance and reliability and lower power consumption for communications systems.

SUMMARY OF VARIOUS EMBODIMENTS

In an embodiment of the invention, a circuit includes a transmitter, a transmission line, and a receiver coupled to the transmitter through the transmission line, the transmission line used to transmit data at high-speed rates. One of the transmitter or receiver has associated therewith an unmatched termination, wherein either the transmitter or the receiver includes a finite impulse response (FIR) filter configured to cancel a reflected signal at a cancellation point situated at an input of a driver, at an output of the driver, at an input of the FIR filter, or an output of the FIR filter. The driver is coupled to an output of the transmitter.

BRIEF DESCRIPTION OF THE DRAWINGS

The foregoing features of embodiments will be more readily understood by reference to the following detailed description, taken with reference to the accompanying drawings, in which:

FIG. 5 is a conceptual illustration representing the embodiment of FIG. 4 but at full, instead of half, clock rate.

FIG. 6 shows further details of the driver of FIG. 5, in accordance with an exemplary implementation thereof.

FIGS. 12 and 13 each shows a table for converting binary input data, using binary Double PAM3 encoding, to analog levels (or signals) by various driver embodiments of the invention.

DETAILED DESCRIPTION OF SPECIFIC EMBODIMENTS

In accordance with various embodiments to follow, cancellation of unabsorbed (or residual) signal reflections, from an unterminated or unmatched terminated side of a transmission link, helps to increase the limit at which (data) symbols are transmitted (symbol rate), over the link, as much as to reach rates enjoyed by double-terminated links, where signal reflections are absorbed on both sides of a link and quickly settle. In accordance with the embodiments of this Invention the residual reflections of a previously-transmitted symbol, which are not absorbed by the receiving side, are cancelled by the time the receiver samples the next symbol that arrives. This is achieved by using a Finite-Impulse Response (FIR) filter that receives a previously-transmitted symbol and generates a correction signal that is substantially equal to the residual reflection signal from the previously-transmitted symbol and subtract that from next transmitted symbols so the reflections are substantially cancelled at the next symbols.

The foregoing cancellation may be implemented in the transmitter by a pre-cancellation of residual reflections, or in the receiver by cancelling the residual reflections at sampling point of next symbols, or both. When in the transmitter, a correction voltage is added to each (data) symbol of the transmitter, similar to the cancellation technique discussed above. The correction voltage, at the transmitter, has a magnitude substantially equal to the magnitude of the non-absorbed (or residual) reflected signal but has an opposite polarity relative thereto. Ideally, the superposition of the correction voltage, on a per-symbol basis, and the residual reflection at the receiver must equal zero or near zero.

Implementation of reflection (signal) cancellation by the receiver, at very high symbol rates, currently requires the design of a feedback timing loop where the timing loop must close within a single symbol cycle, by the receiver. This is not easily implemented because it requires complex and high-power circuitry. Similarly, other prior art techniques, such as those employing "loop unrolled feedback" or "look-ahead" cancellation techniques come with the high price of complex circuit designs.

Figure 1A:
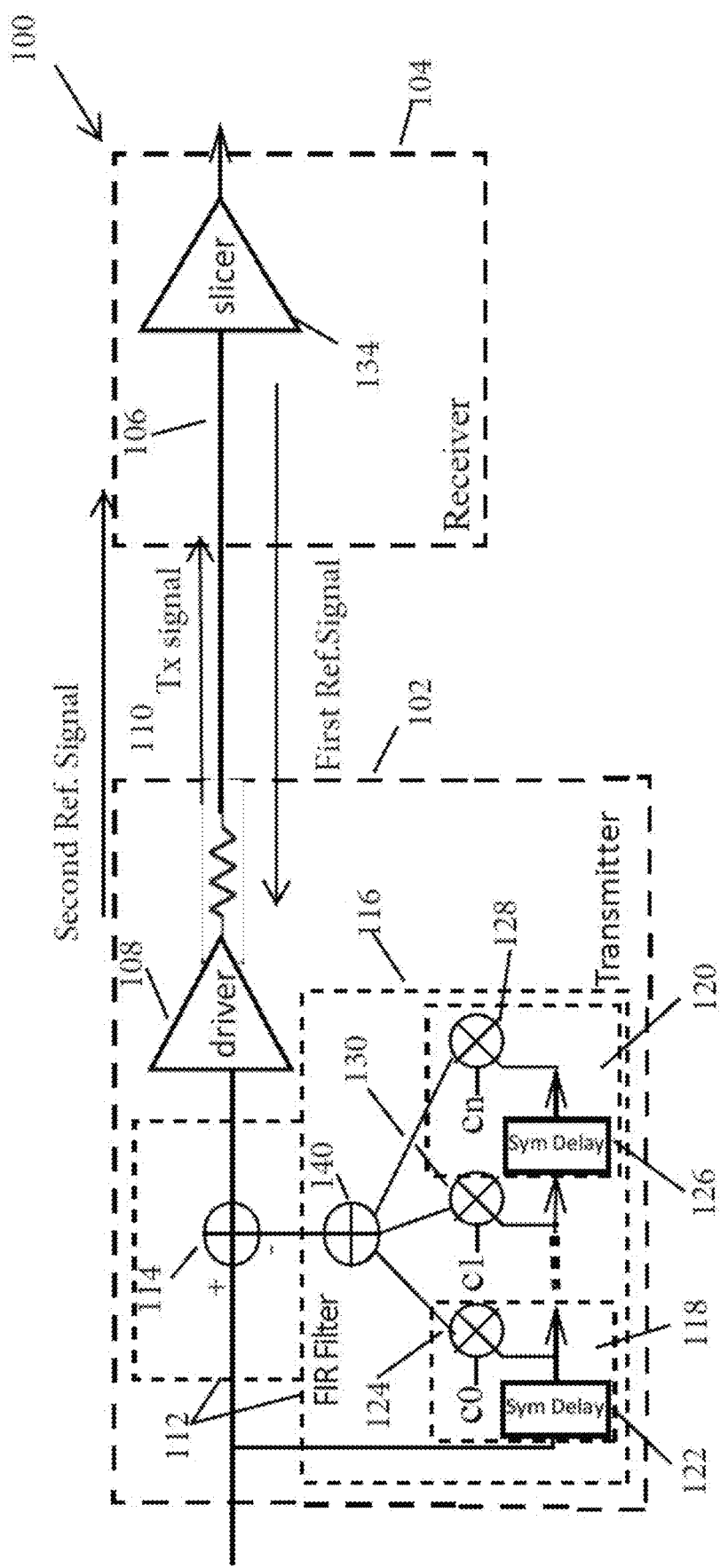
FIGS. 1(a) and 1(b) shows a communications systems 100 and 130, in accordance with an embodiment of the invention.

FIG. 1a shows a communications system 100, in accordance with an embodiment of the invention. The system 100 is shown to include a transmitter 102 and a receiver 104 in communication over a link 106. The transmitter 102 is shown to include a driver 108 that has a resistance associated with it, shown as resistor 110, and a cancellation circuit 112. In the exemplary embodiment of FIG. 1, the cancellation circuit 112 is shown to be a Finite-Impulse Response (FIR) filter 116 with a summer 114. The FIR filter 116 is a series of delay circuits, each including a multiplier and a symbol-delay circuit where the output of a previous symbol-delay circuit serves as one of the inputs to the next symbol-delay circuit of the next delay circuit and is also multiplied by a coefficient to generate the output of the FIR filter 116.

For instance, the FIR filter 116 are shown to include, as shown in FIG. 1a, a number of delay circuits such as 118 and 120. The delay circuit 118 is shown to include the symbol-delay circuit 122 and the multiplier 124. The delay circuit 120 is shown to include the symbol-delay circuit 126 and the multiplier 128. The multiplier 124 of the delay circuit 118 is also shown to have two inputs, one is the output of the symbol-delay circuit 122 and the other is coefficient $C_0$. The outcome of the multiplication of the coefficient $C_0$ with the output of the symbol-delay circuit 122, generated by the multiplier 124, serves as an input to the summer 140. The input to the symbol-delay circuit 126 is another input to the summer 140. Similarly, the output of the symbol-delay circuit 126 of the FIR filter 116, is provided as one of the inputs of the multiplier 128. The multiplier 128 also receives coefficient Cn and multiplies the two inputs to generate an output, which is yet another input to the summer 140. The input to the symbol-delay circuit 126 is the output of the multiplier 130 of an immediately adjacent and previous symbol-delay circuit, not shown in FIG. 1. The multiplier 130 receives coefficient $C_1$ as its second input and performs a similar multiplication function as that of the multipliers 124 and 128 in that it multiplies its two inputs. It is understood that in between the delay circuits 118 and 120 are n−2 number of delay circuits where 'n' is an integer value.

Each of the delay circuits 118 and 120 may also be referred to herein as a "tap" or a "delay tap".

In exemplary implementations, the coefficients are derived during a training or initialization stage, prior to operation, when the transmitter and receiver send and receive signals through the same link and reflective signals can be measured/detected.

Figure 1B:
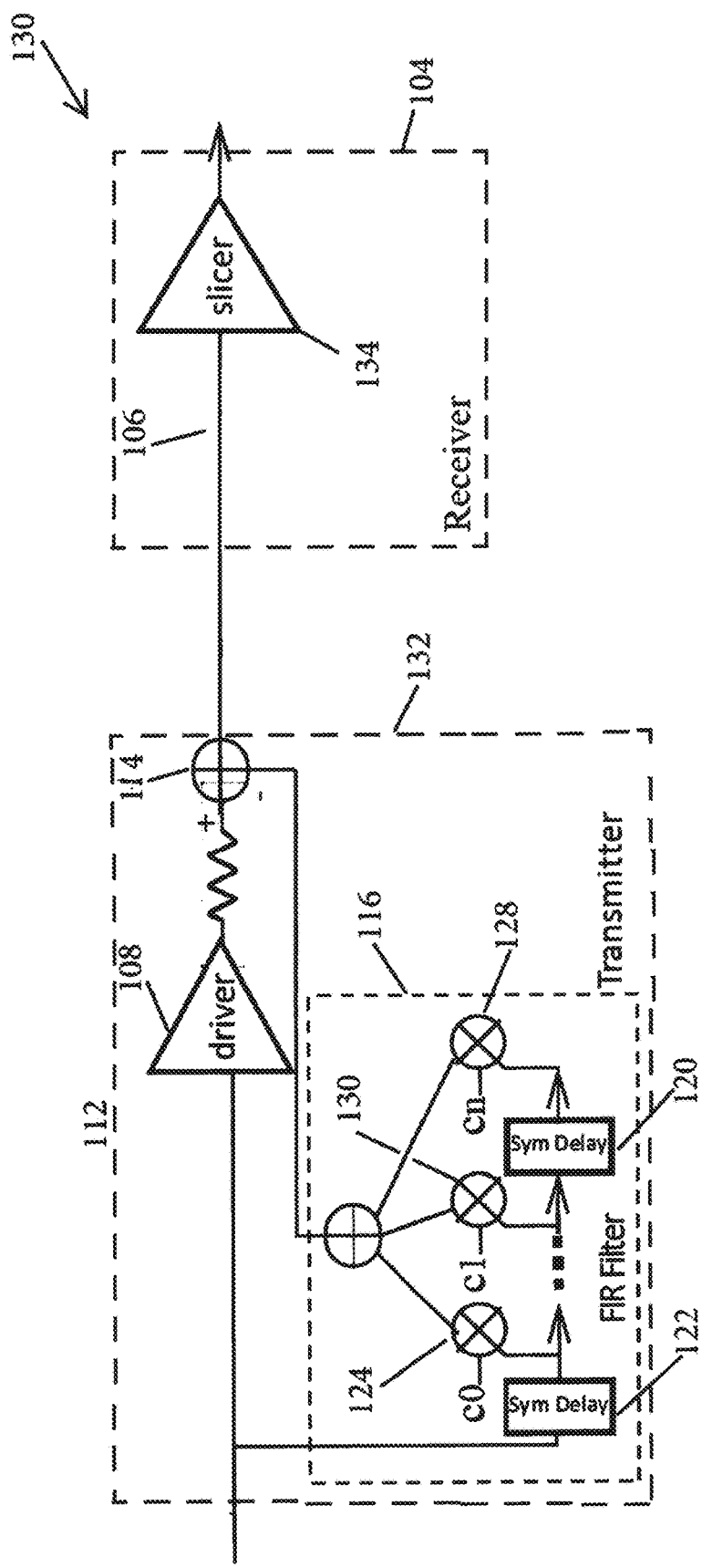

In FIG. 1a, the summer 114 subtracts the outputs of FIR filter, which is the summed output of each of the 'n' delay circuits 118 through 120, from the input data to the driver. The output of the summer 114 serves as input to the driver 108. In another embodiment, the output of the summer 114 Is subtracted from the output of the driver 108, as shown in FIG. 1b. Exemplary implementations of the driver 108 are presented in subsequent figures herein.

The receiver 104 is shown to include a slicer 134, which is analogous to a sampler, such as those known in the art, with an unterminated input, or far-side, and no cancellation circuit.

It is appreciated that the transmitter 102 may use continuous-time symbol-delay circuits or it may use clocked symbol-delay circuits instead, such a flip-flop where data bits are moved from one stage to another at each clock cycle.

The goal of the cancellation circuit 112 of the transmitter 102 is to maximize, or substantially eliminate, signal reflections caused by transmission of previous data symbols, through the link 106, to the receiver 104 that remain unabsorbed. In exemplary embodiments, such as that shown in FIG. 1, the cancellation of signal reflections is based, at least in part, on the accuracy of the transmitted signal levels, the signal levels being amplitudes of signals representing data symbols. Accordingly, reflection cancellation is as accurate as the ratio of transmitted signal levels.

That is, the transmitter 102, upon transmitting a signal to the receiver 104, receives a first reflected signal back (shown by the arrow in FIG. 1) thereby causing transmission of a second reflect signal that is a reflection of the first reflected signal. The second reflected signal is a remainder, or residue, from the part of the first reflected signal that is not absorbed by the transmitter 102 (absorption by resister 110).

More specifically, in the system 100 of FIG. 1, ordinarily, when a signal is transmitted from the transmitter 102 (shown by arrow in FIG. 1), through the link 106, to the receiver 104, due to a lack of termination at the receiver 104, a first reflected signal (shown by arrow in FIG. 1) is caused to travel back to the transmitter 102 where most, but not all, of it is absorbed because of unmatched termination at transmit side. That which is not absorbed at the transmitter 102, second (or residue) reflected signal (shown by arrow in FIG. 1), travels back to the receiver. Clearly, this is undesirable because it causes inter-symbol interference and system performance is degraded. The cancellation circuit 112 removes most, if not all, of this signal from the next data symbol to be transmitted to the receiver 104. The cancellation circuit 112 puts the transmit data signal through the FIR filter 116, whose coefficients are already adjusted during training phase, to generate a cancellation signal that is substantially equal to the second reflected signal, and subtracted that from the transmitted signal. The second reflected signal is then removed from the transmitted signal. The process of determining the second reflected signal is performed by the filter 116 in cancellation circuit 112 during the training or initialization phase.

Coefficient $C_0$ is the ratio of the second reflected signal, after a symbol delay, to the (originally) transmitted signal. $C_1$ is the ratio of the second reflected signal, after a two-symbol delays, to the (originally) transmitted signal, Cn is the ratio of the second reflected signal, after n symbol delays, to the (originally) transmitted signal and so on.

Referring still to FIG. 1a, residual reflected signals (second reflected signal) are cancelled at the source, instead of at the far-side. This can be done because the amplitude of the second reflected signal is measured by the FIR filter 116 and its equivalent negative value (or opposite polarity) is then used to subtract, by the summer 114, from the amplitude of the current symbol being transmitted.

The embodiment of FIG. 1, as with all embodiments shown and discussed herein, the transmitter 102 and receiver 104 may have perfectly matched termination to the line on both ends or they have unmatched termination on either end or both ends. System 100 serves to diminish the effects of the termination mismatch, which is particularly valuable in high speed applications.

When the receiver has no termination, as shown in the system 100 of FIG. 1, the system 100 consumes less power through the channel (or "link") 106 but at the price of increased transmitter circuit complexity due to the requirement for additional filter taps in the FIR filter 116. The same is true for embodiments with unmatched termination on either or both sides, where the termination resistor values are chosen to be higher than channel characteristic impedance in order to use lower current by the driver to generate the same signal voltage level In the latter case, while there are signal reflections, the magnitude of the reflection signal is smaller than it would be compared to non terminated end, thus, reducing the complex circuitry in the FIR filter 116.

In the embodiment of FIG. 1, the speed or quality of the slicer 134, its capability in detecting the next received signal, is not so much of a design limitation due to the cancellation done by the transmitter 102.

Figure 2:
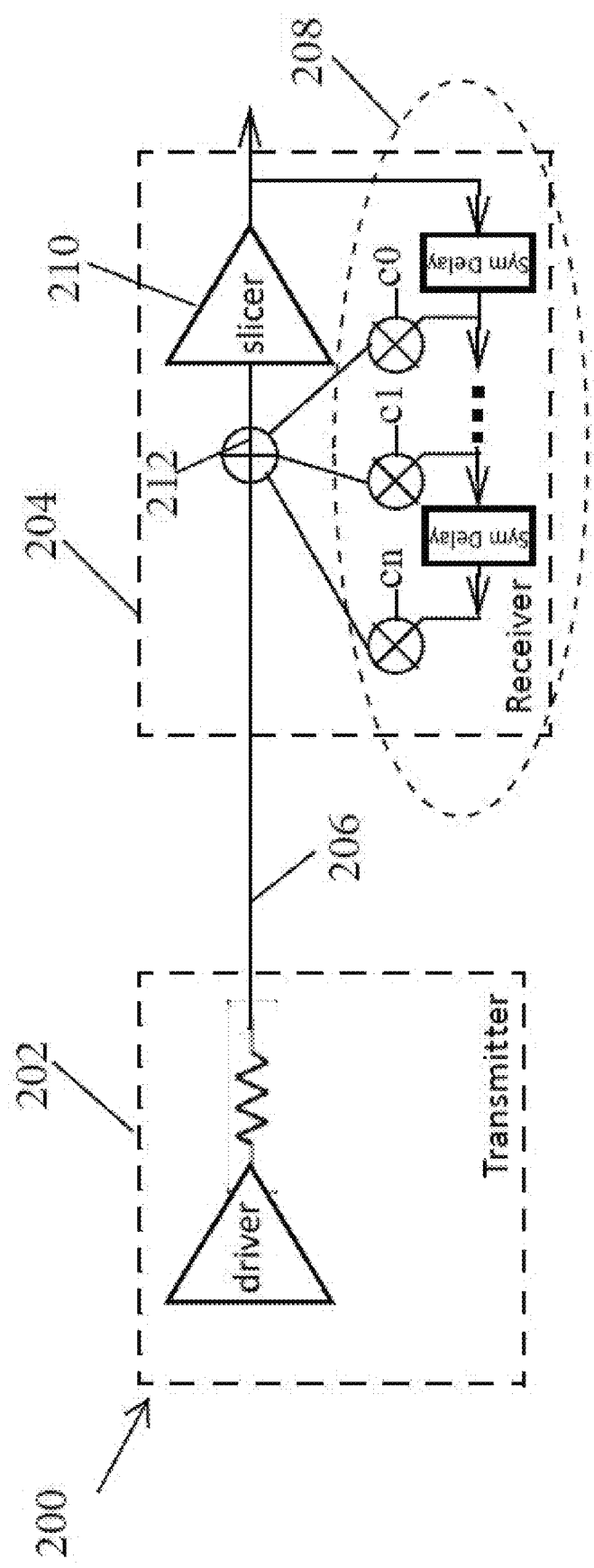
FIG. 2 shows a communication system 200, in accordance with exemplary implementation of the invention.

FIG. 2 shows a communication system 200, in accordance with exemplary implementation of the invention. The system 200 is shown to include a transmitter 102, receiver 104, and link 106, analogous to the system 100, except that the receiver 204 includes a cancellation circuit 208, which is similar to the circuit 116 except that its input is the output of the slicer 210 as opposed to a driver. Also, while the cancellation circuit 116, of system 100, is coupled to an input of the driver 108 with the output of the driver 108 effectively serving as the transmission point for signals, the input of the cancellation circuit 208 is the output of the slicer 210 and its output is coupled to the summer 212 where a second reflected signal is removed from the signal received at the input to the receiver 204. Thus, while, in the system 100, the second reflected signal was removed from a signal about to be transmitted, in the system 200, the second reflected signal is removed right at the input of the receiver 204, from the input signal to the slicer 210. In system 200, the transmitter 202 transmits a signal to the receiver 204 through the link 206, which causes a first signal to be reflected back to the transmitter 202 when the transmitted signal reaches the receiver 204. The first reflected signal is generated at the receiver 204 due to the lack of termination, or lack of matched termination, at the transmitter 202. The first reflected signal reaches the transmitter 202 and causes another reflected signal to travel back to the receiver 204. What remains (second reflected signal) needs to be removed, which is performed by the cancellation circuit 208 by a FIR filter operating on the output of the slicer 210.

An important consideration for reflection cancellation is the accuracy of the transmitted signal levels. Reflection cancellation is as accurate as the ratio of signal levels transmitted. Signaling modulations such as PAM2 and PAM3 are inherently immune to this concern if the transmitter design is symmetrical and balanced. In PAM2 modulation, the transmitted levels are [+1, −1], and PAM3 modulation levels are [+1, 0, −1], with only level "0" added that is easy to generate. Links using other amplitude modulations, such as PAM4 and higher, need to use higher quality transmitter drivers with accurate level spacing. For example, a PAM4 modulation includes levels [+1, +⅓, −⅓, −1] and generating accurate ⅓ levels adds extra complexity to the driver design. So in the disclosed architecture, PAM2 and PAM3 modulations are preferred to minimize complexity in design.

Figures 10, 11:
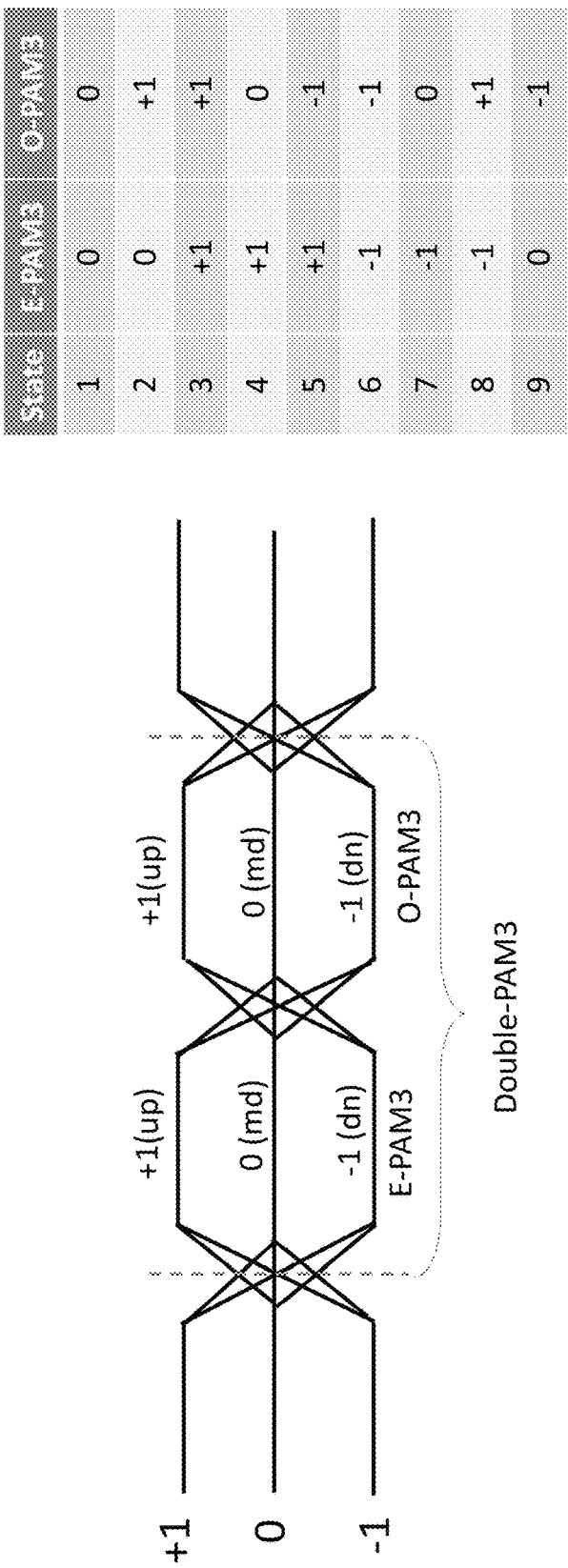
FIG. 10 shows a timing diagram for a double-PAM3 symbol encoding technique, employed in various embodiments of the invention.
FIG. 11 shows a table of exemplary nine states for double-PAM3 encoding and possible assignments using three values or bits.

In various embodiments of the invention, which result in efficient communication over short links, Compound-Symbol coding of "Double PAM3", is employed. In this coding scheme, every two PAM3 symbols construct a Compound-Symbol as shown in FIG. 10. FIG. 11 shows a table of exemplary nine states for double-PAM3 encoding and possible assignments using three levels [−1, 0, +1]. These 9 states can represent 3 bits of binary, representing 8 states, plus an extra state. The proposed Double-PAM3 modulation delivers same data rate as a PAM2 modulation at ⅔ the symbol rate required by PAM2 modulation.

FIGS. 10 and 11 can be viewed together because they both show various states corresponding to certain symbols, FIG. 10 in the form of a timing diagram and FIG. 11 in the form of a table. For example, a state '1' is represented by both of the double-PAM3 symbols, i.e. E-PAM3 (for even symbols) and O-PAM3 (for odd symbols), both being '0's in the table of FIG. 11 and at a voltage level of mid-level (md) in the timing diagram of FIG. 10. State '2' is represented by E-PAM3 being '0' and O-PAM3 being '+1' in the table of FIG. 11 and at voltage levels 'md' and 'up', respectively, in the timing diagram of FIG. 10.

Figure 3:
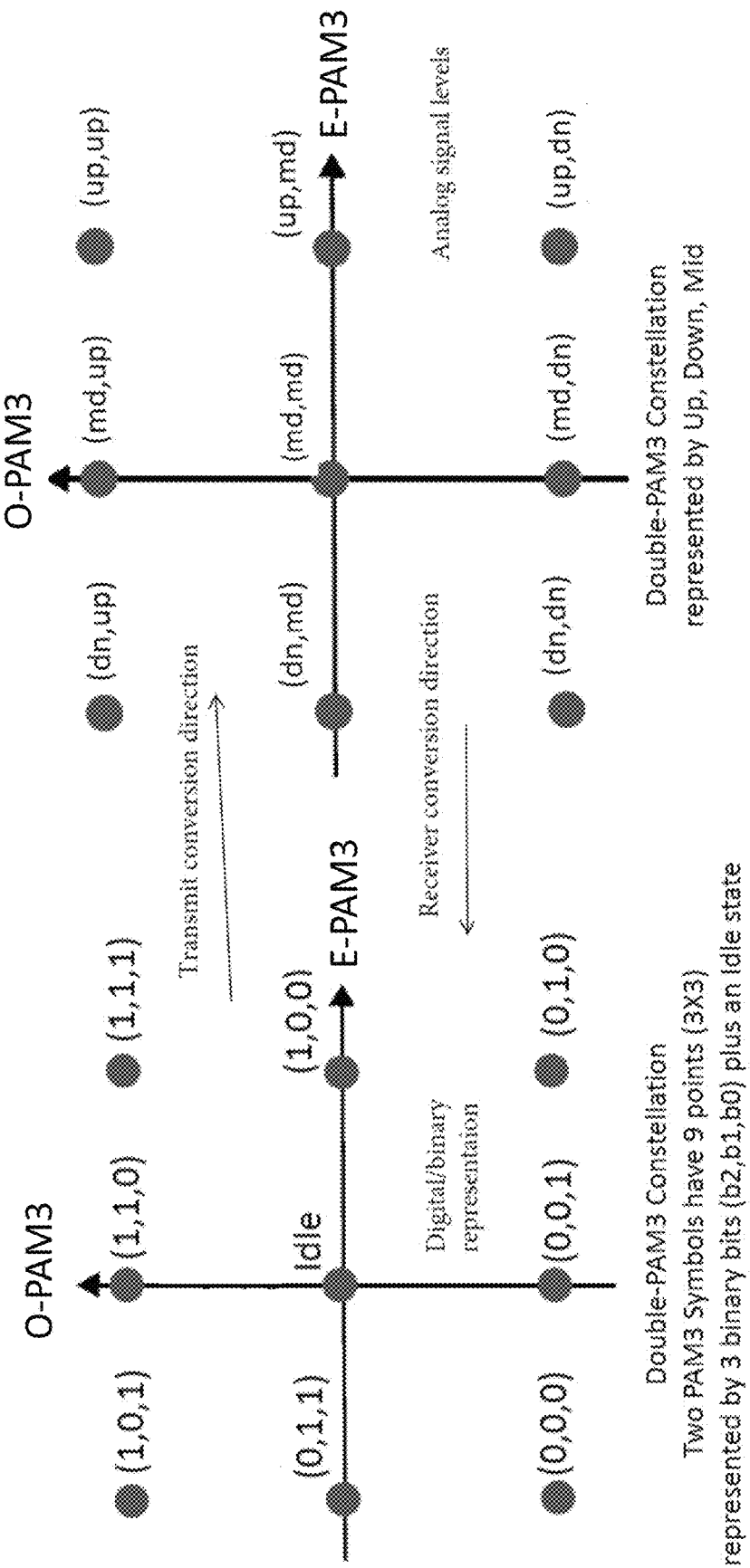
FIGS. 3(a) and 3(b) each illustrate constellation of an exemplary type of coding, in accordance with various exemplary implementations.

FIGS. 3(a) and 3(b) each illustrate the constellation of the double-PAM3. FIG. 3(a) shows the constellation for a double-PAM3 coding representing 9 distinct states defined by the signal levels (up, md, dn) of the two PAM3 symbols in the double-PAM. Each constellation has two axes, each one representing a symbol. In FIG. 3a, the symbols of the constellation are represented by "up", "dn", and "md", which stand for up, down and mid, respectively. Another way to look at them is +1, −1, and 0, with '0' representing mid. Mid is substantially a voltage with a level that is substantially half of the level representing up or down (or +1 and −1). Accordingly, at the center of the constellation is the double symbols (md, md) or '0'. FIG. 3(b) shows the same constellation represented by three binary bits and one extra state. The extra state is referred to herein as "Idle", that may be used to convey additional information through the link 106. For example, such an extra state may be used as an advertising idle state, or for defining byte or word boundaries, or as a low-power mode state when there is no data to be transmitted, among other utilizations. The latter is an important power-saving feature of the proposed Double-PAM3 modulation to be considered In mobile applications where power conservation Is extremely Important and data transmission is not happening at all times.

The transmitter can Include an encoder that converts the 3-binary bits plus the idle state of FIG. 3b into the tri-level two-symbol PAM3 constellation of FIG. 3a. A receiver decoder receives the 3 levels in received double-PAM3 symbol from the receiver slicer and decodes them into 3 binary bits plus an Idle state.

Figure 4:
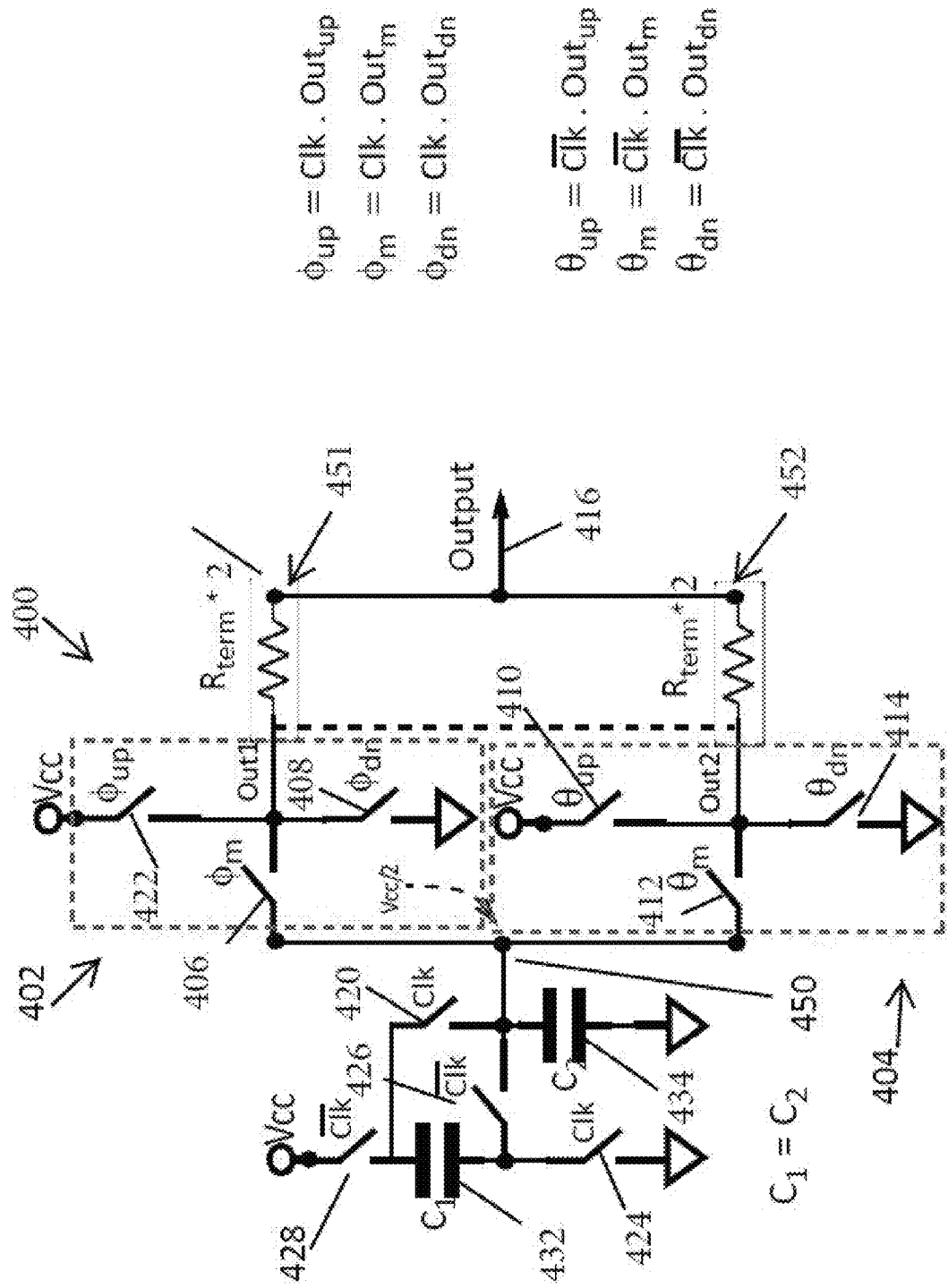
In FIG. 4, driver 300, analogous to the driver 108 of FIG. 1, is shown to include circuits 302 and 304, shown coupled in-parallel to each other.

FIG. 4 is an exemplary driver circuit of a power-efficient implementation of a PAM3 half-rate single-ended transmitter.

In FIG. 4, driver 400, analogous to the driver 108 of FIG. 1, is shown to include circuits 302 and 304, shown coupled in-parallel to each other. Each of the circuit 402 and 404 is activated during a half cycle of the sampling clock. For example, the circuit 402 may be activated when the clock is at one phase, with the circuit 304 being inactive in this configuration, while the circuit 402 is inactive, during an opposite phase of the clock, while the circuit 404 is activated during the latter configuration. Phases of the clock are represented by the level (or amplitude) of the clock. In binary terms, the clock's level being over a certain threshold may represent '1' and the clock's level being under the same threshold may represent '0', or vice versa.

The output 416 of the circuit 400 is generated by the three different levels, also referred to herein as "up", "md" and "down" levels and realized by switches coupled to the supply voltage (Vcc), Internally generated voltage Vcc/2 and ground, i.e. switches 322, 406 and 408 of the circuit 402 and switches 410, 412 and 414 of the circuit 404, followed by a respective termination resistor ($R_{term}$), $R_{term}$ 451 and $R_{term}$ 452, respectively, matched to the characteristic impedance of the transmission line that couples with the output 416, carrying signals to their destination. The resistance of each of the $R_{term}$ 451 and $R_{term}$ 452 is equal to the characteristic impedance of the transmission line, such as the link 106. However, the two resistors can also be connected in parallel (dotted line in FIG. 4 Is shorted), the resistance of each of the $R_{term}$ 451 and $R_{term}$ 452 is equal to 2 times the characteristic impedance of the transmission line.

Phases (or levels or amplitudes) of the clock signal, used by the driver, is shown in FIG. 4 in the form of three equations. "up" represents a high (or +1) analog value while "dn" represents a low value, such as −1, and "md" represents a mid-range value, or "0". "$Out_{up}$", "$Out_{md}$" and "$Out_{dn}$" represents one of three possible inputs to the driver that in combination with "Clk" and "Clk bar", which represent two phases of the clock signal, generate the proper transmit signal at output 416 in either half cycle of the clock. For example, "Clk" is high during one of the ½ cycles of the clock signal and "$Clk_{bar}$" is high during the other one of the ½ cycles of the same clock signal. During the first half clock cycle where "Clk" is high and the driver is to transmit an "up" (or "md" or "dn") value, "$Out_{up}$" (or "$Out_{md}$" or "$Out_{dn}$" respectively) will be high, thus the product "$\phi_{up}$=Clk. $Out_{up}$" (or "$\phi_{md}$=Clk. $Out_{md}$" or "$\phi_{dn}$=Clk. $Out_{dn}$") will be high and switch 422 (or 406 or 408 respectively) is closed. Thus, the half driver 402 generates a +1 (or "0" or "−1) value on the output 416. Similarly, in the other half cycle when "$Clk_{bar}$" is high and the driver is to transmit an "up" (or "md" or "dn") value, "$Out_{up}$" (or "$Out_{md}$" or "$Out_{dn}$" respectively) will be high, thus the product "$\theta_{up}$=$Clk_{bar}$·$Out_{up}$" (or "$\theta_{md}$=$Clk_{bar}$· $Out_{md}$" or "$\theta_{dn}$=$Clk_{bar}$·$Out_{dn}$" respectively) will be high and switch 410 (or 412 or 414 respectively) is closed. Thus, half driver 304 generates a +1 (or "0" or "−1) value on the output 306

In addition, the circuit 400 is shown to include capacitors 432 and 434 and switches 420, 424, 426, and 428. When switches 420 and 424 are in closed position during the position phase of the clock, the capacitor 432 Is coupled to ground and capacitor 434, accordingly, the two capacitors are coupled In parallel and their voltages across them is equal. If the two capacitors 432 and 434 are equal In capacitance value, the charge on the two capacitors Is also equal.

When switches 428 and 426 are in a closed position, which occurs during the negative phase of the clock signal, the capacitor 432 is coupled to Vcc and to capacitor 434, accordingly, the two capacitors are coupled in series relative to one another. If the two capacitors are of the same value and with equal Initial charge, the voltage at node 450 is half of the voltage Vcc, or Vcc/2. This provides the distinct level Vcc/2, supplied to each half driver 402 and 404, associated with "md" level.

The mid-level "md" of Vcc/2 for PAM3 is generated by capacitive division between the supply voltage (Vcc) and ground, which acts effectively as a switching capacitive regulator. A switching capacitive regulator typically has a much higher power efficiency compared to a linear regulator, but it does not have a great current delivery capability. In applications that high current delivery capability Is not required, such as the proposed driver 400 of FIG. 4, the use of the proposed switching capacitive regulator helps reduce the total power consumption.

FIG. 5 is a conceptual illustration representing the embodiment of FIG. 4 but at full, instead of half, clock rate. That is, switches switch a new data value at each clock signal rather than at each phase of each clock signal. FIG. 5 shows a driver 500 which includes a capacitor 502, switch 504, switch 506, inverter 508, switches 510 and 512, and $R_{term}$. The equations for $\phi_{up}$, $\phi_{dn}$, $\phi_m$ are analogous to those shown and described relative to FIG. 4. The inverter 508, capacitor 502, and switch 504 form a boost circuit collectively. The boost circuit functions to boost the input drive voltage of the switch 506 and turns this switch on and off accordingly. This is important in a practical implementation where, for example, a NMOS (or PMOS) device is used as the switch 506. NMOS (or PMOS) devices of equal size can be used for switches 512 (or 510). The gate terminal of the pull-down switch 512 gets a drive voltage of Vdd (or ground in case of PMOS used for switch 510), and because its source terminal is coupled to ground (or Vdd In case of switch 510), its gate-source overdrive voltage is equal to Vdd when it is to turn on. In implementations where the switch 506 is only a NMOS device (or only a PMOS device), it has a low impedance when turned on and similar to the switch 512, its gate-source overdrive voltage need be Vdd. When the source terminal of the switch 506 is coupled to Vdd/2, its gate voltage need be boosted to Vdd+Vdd/2 (or Ground-Vdd/2 for if PMOS used for switch 504). The boost circuit for switch 504 replaced by NMOS device has two following cycle:

1—First Cycle is the pre-charge cycle, in which $\phi_m$ is "0", thus input Gate of switch 504 is "1" and it is on, connecting "+" terminal of capacitor 502 to Vdd/2, and the other terminal of capacitor 502 (terminal "−") is connected pulled to "O". Therefore, Capacitor 502 is charged with a voltage of +Vdd/2; and 2—Second cycle is the boost cycle, in which Phi_m is "1", thus the input Gate of switch Sb is "0" and it is off, so "+" terminal of capacitor Cm is disconnected from Vdd/2. The other terminal of capacitor Cm (terminal "−") is pulled high to "1" or Vdd. As a result, the "+" terminal of Cm that is connected to Sm NMOS will go to Vdd+Vdd/2 or 3/2*Vdd as planned.

FIG. 6 shows further details of the driver of FIG. 5, in accordance with an exemplary implementation thereof. In FIG. 6, the driver 600 is shown to include a buffer 602, an inverter 604, a capacitor 606, transistors 608 and 610, buffer 614, inverter 612, and transistors 616 and 618. The buffer 602, inverter 604, capacitor 606, and transistor 608, collectively, are analogous to the boost circuit of FIG. 5, made from the combination of inverter 508, capacitor 502, and switch 504, and collectively function similarly thereto. The transistor 616 is a PMOS transistor and the transistor 618 is an NMOS transistor, in accordance with an exemplary implementation of the invention and each function as switches 510 and 512, respectively.

The transistor 608 is analogous to the switch 504 and functions accordingly.

Figure 7:
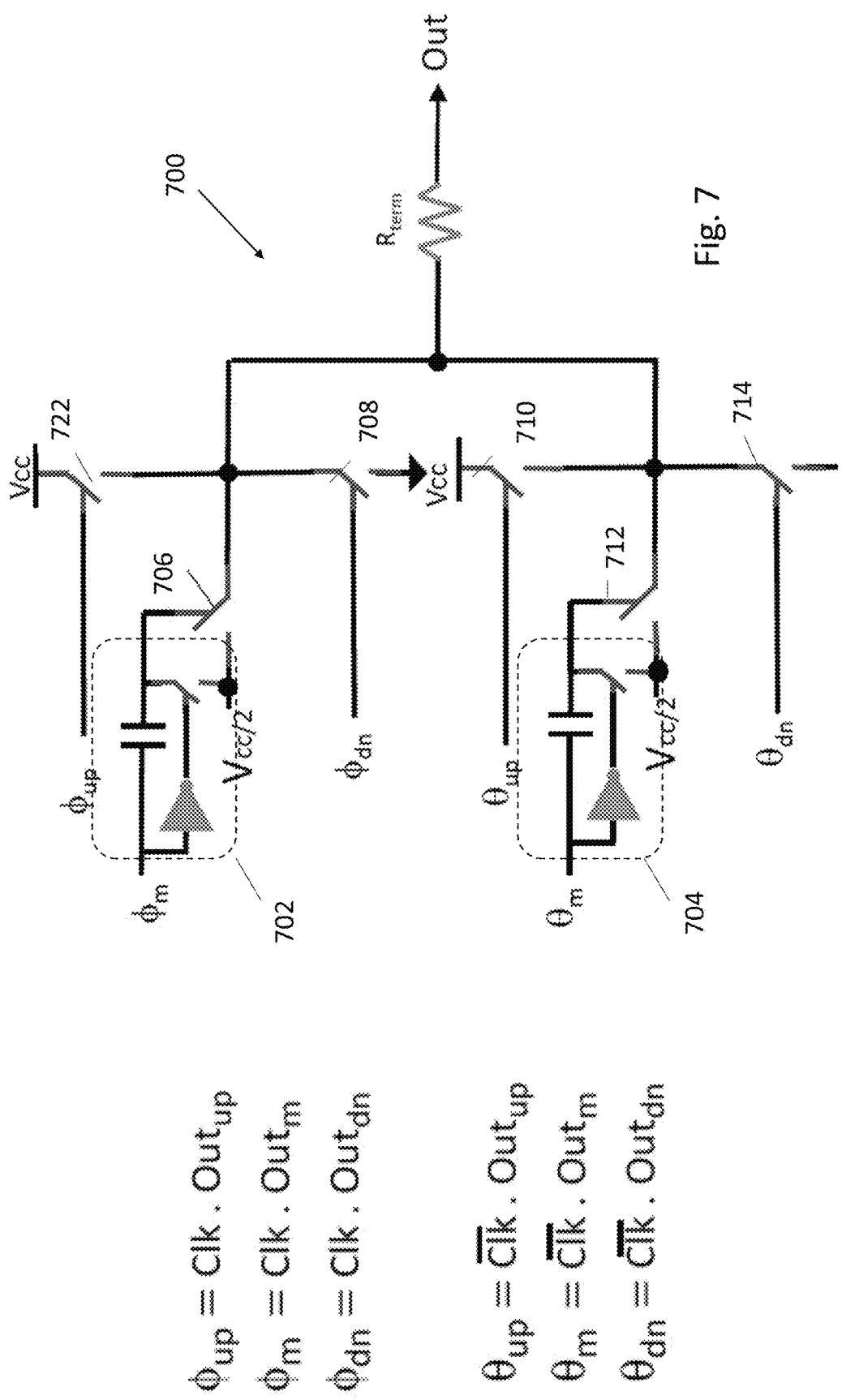
FIG. 7 shows a conceptual illustration of the embodiment of FIG. 4 but with booster circuits.

FIG. 7 shows a conceptual illustration of the embodiment of FIG. 4 but with booster circuits that are required for the practical implementation of the middle switches 706 and 712 when it is replaced by a NMOS device. In FIG. 7, the driver 700 is shown to include two booster circuits 702 and 704, one for the circuit that actives during the positive phase of the clock signal and the other for the circuit that activates during the negative phase of the clock signal, respectively. The operation of the driver In FIG. 7 is exactly the same as that of FIG. 4 plus the Inclusion of the two booster circuits for driving each of the middle switches 706 and 712

Figure 8:
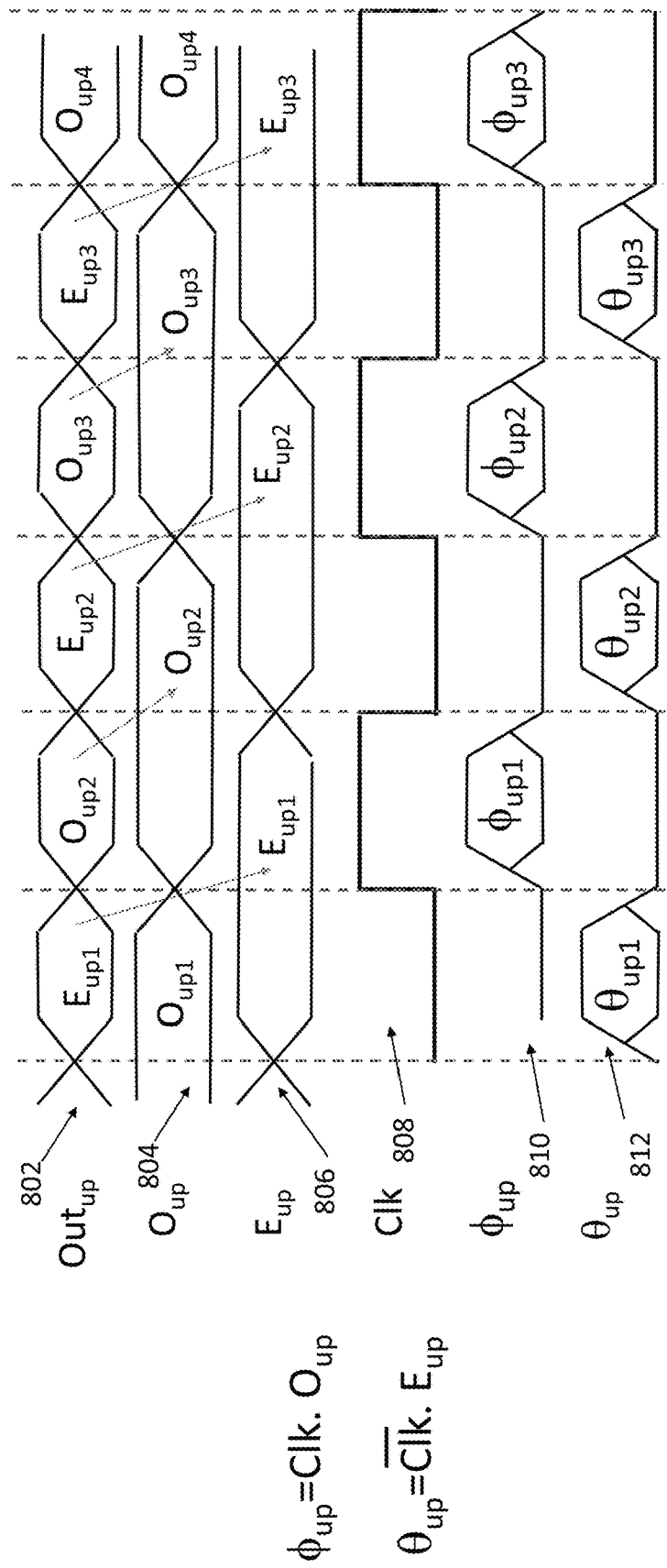
FIG. 8 shows a timing diagram of a half-rate driver, such as the driver of FIGS. 4 and 7, in accordance with an exemplary implementation.

FIG. 8 shows a timing diagram of a half-rate driver, such as the driver of FIGS. 4 and 7, in accordance with an exemplary implementation. In FIG. 8, the timing diagram of the data only for the $Out_{up}$ is shown, where "$Out_{up}$" represent a high value when "up" signal Is to be transmitted to the output. Also to be noted is that data is broken down into even and odd symbols. Accordingly, at 802, the timing diagram of the data for $Out_{up}$ is shown at full rate meaning data changes at each phase of the half rate clock. At 804, the timing diagram for the odd symbols of the data is shown and at 806, the timing diagram for the even symbols of the data is shown. As shown in FIG. 8, each of the odd and even symbols are at half rate, meaning they change at each cycle of the half-rate clock, not at each high or low phase of the half-rate clock. At 808, the timing diagram of the half-rate clock signal, or Clk, is shown relative to the data symbols. Further shown are $\phi_{up}$ and $\theta_{up}$, at 810 and 812, respectively. $\phi_{up}$ carries the value of $Out_{up}$ only during positive phases of the clock signal, Clk, and drives that value to the output by controlling the "up" switch in one of the half drivers. Whereas, $\theta_{up}$ carries the value of $Out_{up}$, only during negative phases of Clk, and drives that value to the output by controlling the "up" switch in the other half driver.

Figure 9:
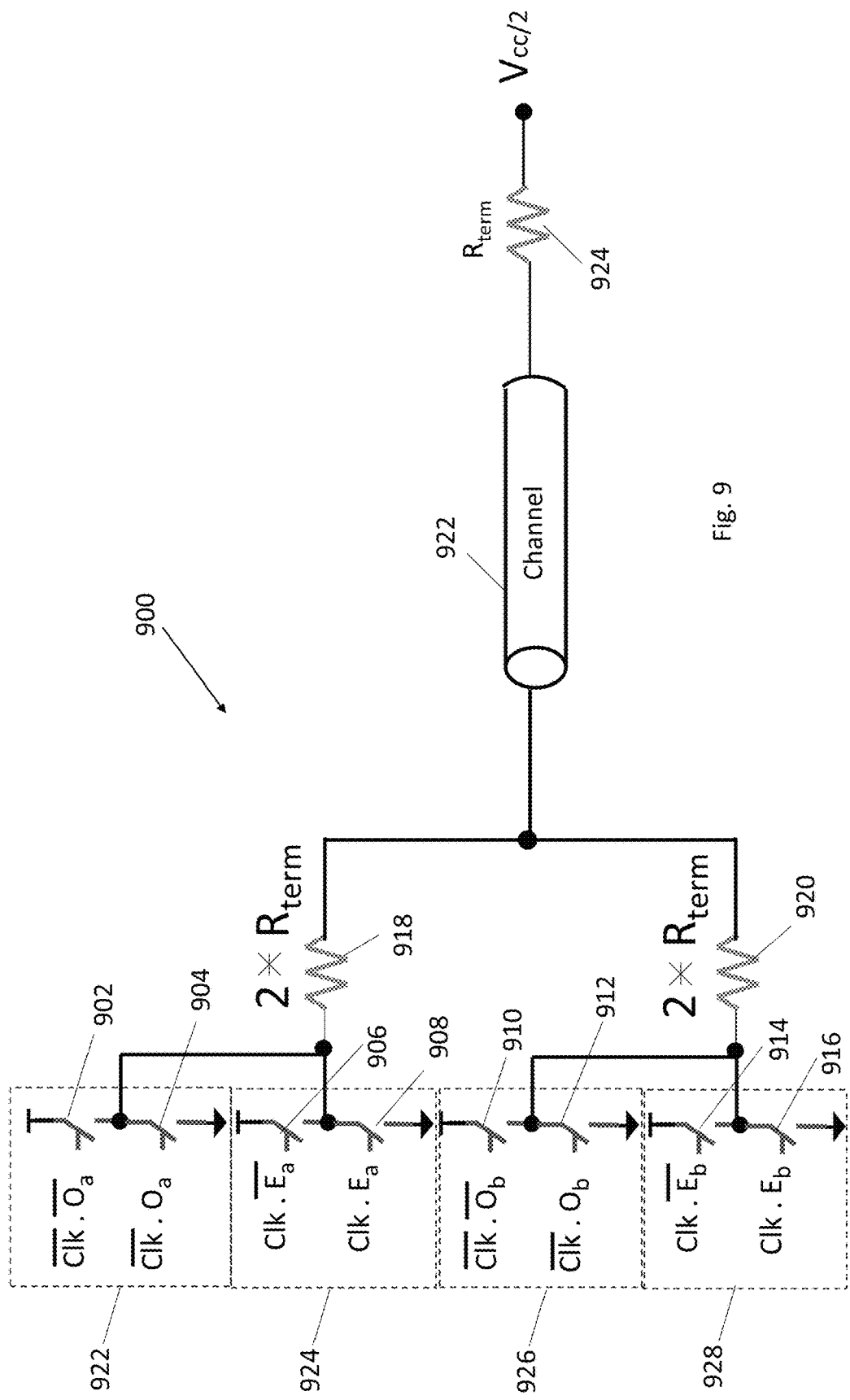
FIG. 9 shows yet another exemplary implementation of a driver with two parallel $R_{term}$ resistances.

FIG. 9 shows yet another exemplary implementation of a driver with two $R_{term}$ resistances. The timing of FIG. 9 can be thought to be a similar to the timing diagram as shown by FIG. 8 where data symbols are output onto Out, as are even and odd symbols thereof, during each phase of a clock cycle, with the use of switches 902-916. The driver 900 consists of four sub-drivers 922-928. In the positive phase of the clock signal, sub drivers 924 and 928 are activated to drive the even data value onto output. To drive a +1 level (or Vdd) to the output, the top switches 906 and 914 are both closed, and they couple the resistors 918 and 920 in parallel together and to Vdd. The resistor 918 and 920 each have a value of $2 \times R_{term}$. Therefore, effective parallel value of the resistors is $R_{term}$. To drive a −1 level (or ground) to the output, the top switches 908 and 916 are both closed, and they couple the resistors 918 and 920 in parallel together and to ground. However, to drive a 0 level (or Vdd/2) to the output, the top switch 906 in sub-driver 924 and switch 916 In sub-driver 928 are closed, and they couple the resistor 918 to Vdd and 920 to ground, generating an output voltage that is substantially at Vdd/2. Alternative, to drive a 0 level onto output, the top switch 908 in sub-driver 924 and switch 914 In sub-driver 928 are closed, and they couple the resistor 918 to around and 920 to Vdd, generating an output voltage that is substantially at Vdd/2.

Figure 12:
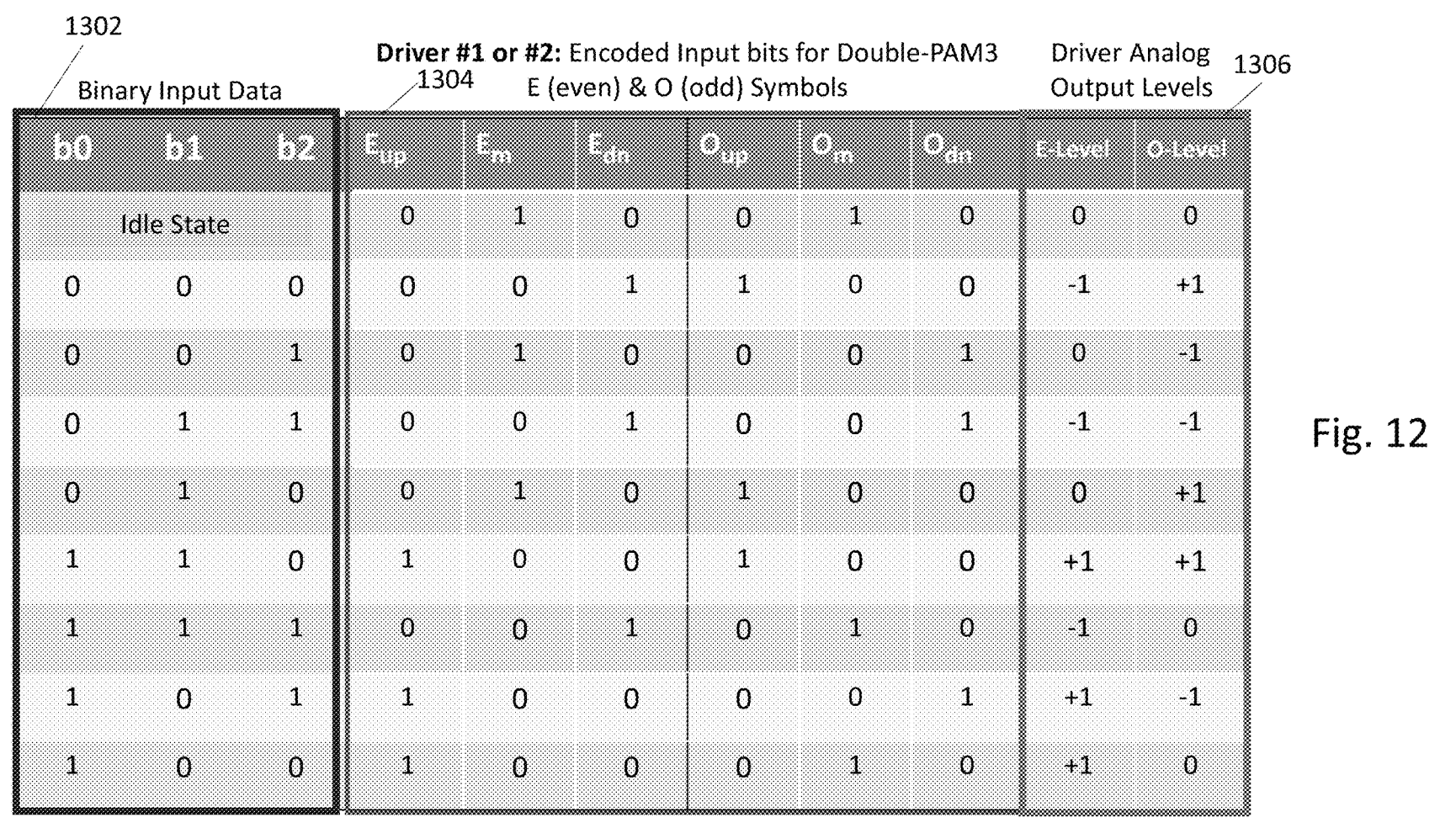

FIGS. 12 and 13 each shows a table for converting binary input data, using binary Double PAM3 encoding, to analog levels (or signals) by various driver embodiments of the invention. The table of FIG. 12 corresponds to the drivers of FIGS. 4-7 and the table of FIG. 13 corresponds to the driver of FIG. 9. It is understood that the encoding table presented herein is merely an example for the sake of further understanding and is not any kind of limitation of the scope of the invention.

In FIG. 12, three binary input data, for instance '000', '001', and so on, shown at 1302, are each input to the driver. These bits are encoded, by the driver, such as shown by even and odd symbols, at 1304, where corresponding analog output levels are output by the driver for each binary state, shown at 1306.

Similarly, in FIG. 13, at 1402, binary input data to the driver is shown, using three bits, and at 1404, the encoded version of the input bits, as performed by the driver, are shown, and finally, at 1406, the output of the driver is shown as various analog output levels. Additionally, shown in FIG. 13, is the use of "Idle" state as a high impedance state for the switches, leaving all open. This state may be used during inactivity or power-down.

In some embodiments of the invention, the transmitters of the various exemplary communications systems shown and discussed herein are each formed on a semiconductor (or chip) separate and apart from a semiconductor onto which each transceiver is formed. For example, the transmitter 102 may be formed on chip A and the receiver 104 may be formed on chip B. Chips A and B may be on the same device and therefore connected through a wire, such as a smart phone, or rather far apart and communicating through a wireless transmission link. For example, one chip may be a part of a smart phone while the other chip may be a part of the base station with which the smart phone may communicate. In other embodiments, the transmitters and transceivers may each be a device or a combination of a device and a chip. Various configurations are contemplated.

It will be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above. Although the description has been described with respect to particular not restrictive.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The embodiments described above are intended to be merely exemplary; numerous variations and modifications will be apparent to those skilled in the art. All such variations and modifications are intended to be within the scope of the present invention as defined in any appended claims.

What is claimed is:

1. A circuit comprising:
   a transmitter;
   a transmission line; and
   a receiver coupled to the transmitter through the transmission line at high speed rates, at least one of the transmitter or receiver having associated therewith unmatched termination, wherein a Double-PAM3 modulation for data transmission across the transmission link is used to reduce complexity of the transmitter and the receiver while transmitting an effective same data rate as a PAM2 at ⅔ of the symbol rate.

2. The circuit of claim 1, wherein at least one of the transmitter or receiver is not terminated or terminated with an impedance higher than a characteristic impedance of the transmission link to reduce power consumption.

3. The circuit of claim 1, wherein either the transmitter or the receiver includes a finite impulse response (FIR) filter configured to cancel a reflected signal at a cancellation point situated at an input of the receiver, at an input of a driver, at an output of the driver the driver being coupled to an output of the transmitter.

4. The circuit of claim 3, wherein PAM3 symbol is used to eliminate complexity of the driver to generate highly accurate output levels other than [+1, 0, −1] that is necessary for proper reflection cancellation.

5. The circuit of claim 3, wherein the Double-PAM3 symbol carries 3 binary data bits plus an Idle state, wherein the Idle state is selected to be the lowest power state of the transmission link and in order to save power during no data activity, the transmission link transmits the Idle state.

6. The circuit of claim 3, wherein the reflected signal originates from a circuit with no termination or unmatched termination to the transmission line.

7. The circuit of claim 1, further including a switching capacitive regulator to generate a middle voltage level for PAM3 in addition to Vdd and ground for PAM3 signal generation to save power.

8. The circuit of claim 1, wherein the transmitter includes a finite impulse response (FIR) filter, the FIR filter being configured to multiply one or more previous symbols each with a distinct coefficient to generate a cancellation signal, wherein the cancellation signal is subtracted from a current symbol and is substantially equal to a superposition of a reflected signal of the one or more previous symbols at the receiver when the current symbol arrives at the receiver.

9. The circuit of claim 1, wherein the driver includes a series of switch pairs, each switch pair being controlled by a distinct phase of a clock signal and wherein an output of each switch pair is an output or even or odd symbols.

10. The circuit of claim 1, wherein the Double-PAM3 symbol carries 3 binary data bits plus an Idle state, wherein the Idle state is selected to be the lowest power state of the transmission link and in order to save power during no data activity, the transmission link transmits the Idle state.

11. The circuit of claim 1, wherein the driver includes four switch pairs, each switch pair being controlled by one of two even or two odd input bits representing a Double-PAM3 symbol and a distinct phase of a clock signal, and every two switch pairs with different phase of the clock are grouped together with a shorted output node where one is controlled by an odd input bit and the other by an even input bit, and further the output of every two switch pair group is coupled to the transmission line with a resistor.

12. A circuit comprising:
    a transmitter;
    a transmission line;
    a receiver coupled to the transmitter through the transmission line at high speed rates, wherein a Double-PAM3 modulation for data transmission across the transmission link is used to reduce complexity of the transmitter and the receiver; and
    a boosted-voltage circuit to turn on a mid switch in practical applications when a NMOS or a PMOS transistor is used for a mid switch so that NMOS or PMOS gate-source overdrive voltage gets higher than Vdd/2.

13. A circuit comprising:
    a transmitter;
    a transmission line; and
    a receiver coupled to the transmitter through the transmission line at high speed rates, at least one of the transmitter or receiver having no termination, wherein either the transmitter or the receiver includes a finite impulse response (FIR) filter configured to cancel a reflected signal at a cancellation point situated at an input of the receiver, at an input of a driver, at an output of the driver, the driver being coupled to an output of the transmitter.

14. The circuit of claim 13, wherein a Double-PAM3 modulation for data transmission across the transmission link is used to reduce complexity of the transmitter and the receiver while transmitting an effective same data rate as a PAM2 at ⅔ of the symbol rate.

15. The circuit of claim 14, wherein PAM3 symbol is used to eliminate complexity of the driver to generate highly accurate output levels other than [+1, 0, −1] that is necessary for proper reflection cancellation.

16. The circuit of claim 13, further including a switching capacitive regulator to source a middle voltage level for PAM3 in addition to Vdd and ground to save power.

17. The circuit of claim 13, further including a boosted-voltage circuit to turn on the mid switch in practical applications when a NMOS or a PMOS transistor is used for the mid switch so that NMOS or PMOS gate-source overdrive voltage gets higher than Vdd/2.

18. The circuit of claim 13, wherein the reflected signal originates from a circuit with no termination or unmatched termination to the transmission line.

19. The circuit of claim 13, wherein the transmitter includes the FIR filter and the FIR filter is configured to multiply one or more previous symbols each with a distinct coefficient to generate a cancellation signal, wherein the cancellation signal is subtracted from a current symbol and is substantially equal to a superposition of the reflected signal of the one or more previous symbols at the receiver when the current symbol arrives at the receiver.

20. The circuit of claim 13, wherein the driver includes four switch pairs, each switch pair being controlled by one of two even or two odd input bits representing a Double-PAM3 symbol and a distinct phase of a clock signal, and every two switch pairs with different phase of the clock are grouped together with a shorted output node where one is controlled by an odd input bit and the other by an even input bit, and further the output of every two switch pair group is coupled to the transmission line with a resistor.

* * * * *